(12) United States Patent
Kulinets et al.

(10) Patent No.: US 7,557,742 B2
(45) Date of Patent: Jul. 7, 2009

(54) PIPELINED/CYCLIC ARCHITECTURES FOR ANALOG-DIGITAL SIGNAL CONVERSION

(75) Inventors: Joseph M. Kulinets, North Andover, MA (US); Peter R. Nuytkens, Melrose, MA (US); Oleg Korobeynikov, Swampscott, MA (US)

(73) Assignee: Custom One Design, Inc., Melrose, MA (US)

( * ) Notice: Subject to any disclaimer, the term of this patent is extended or adjusted under 35 U.S.C. 154(b) by 0 days.

(21) Appl. No.: 11/961,960

(22) Filed: Dec. 20, 2007

(65) Prior Publication Data

US 2008/0158031 A1    Jul. 3, 2008

Related U.S. Application Data

(60) Provisional application No. 60/875,992, filed on Dec. 20, 2006.

(51) Int. Cl.
*H03M 3/00* (2006.01)
(52) U.S. Cl. ........................... 341/143; 341/155
(58) Field of Classification Search .......... 341/143–155
See application file for complete search history.

(56) References Cited

U.S. PATENT DOCUMENTS

| | | | | |
|---|---|---|---|---|
| 5,892,468 A | * | 4/1999 | Wilson et al. | 341/143 |
| 6,140,952 A | * | 10/2000 | Gaboury | 341/143 |
| 6,456,950 B1 | * | 9/2002 | El-Ghoroury et al. | 341/139 |
| 6,518,902 B2 | * | 2/2003 | Panasik et al. | 341/141 |
| 6,842,129 B1 | * | 1/2005 | Robinson | 341/143 |

* cited by examiner

*Primary Examiner*—Lam T Mai
(74) *Attorney, Agent, or Firm*—Goodwin Procter LLP (57) ABSTRACT

Methods and apparatus for the conversion of analog signals into digital signals using second order or higher sigma-delta modulators in pipelined or cyclic architectures.

18 Claims, 7 Drawing Sheets

*FIG. 1*

*PRIOR ART*

PIPELINED/CYCLIC ARCHITECTURES FOR ANALOG-DIGITAL SIGNAL CONVERSION

CROSS-REFERENCE TO RELATED APPLICATIONS

This application claims the benefit of U.S. Provisional Patent Application No. 60/875,992, filed on Dec. 20, 2006, which is hereby incorporated by reference as if set forth herein in its entirety.

FIELD OF THE INVENTION

The present invention relates to methods and apparatus for the conversion of analog signals into digital signals, and in particular to the use of a plurality of sigma-delta converter stages for analog-digital conversion.

BACKGROUND OF THE INVENTION

An analog-to-digital converter (ADC) converts a continuous voltage signal into a time-varying sequence of digital numbers. This permits digital devices, such as computers, to process real world signals, such as measurements of sound and temperature. Many different types of ADCs are known, including sigma-delta converters (SDC).

Figure 1:
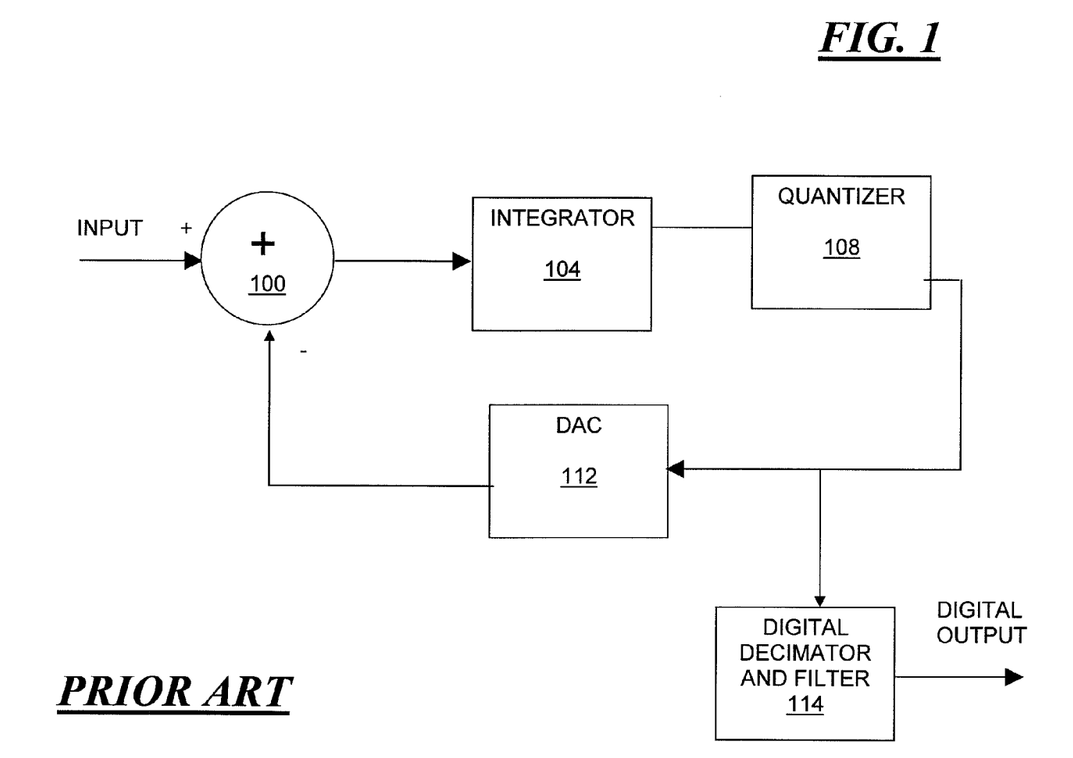
FIG. 1 is a block diagram of a prior art first-order sigma-delta converter.

FIG. 1 presents an example of a prior art first-order SDC. In this SDC, a continuous voltage signal is oversampled and provided to a adder 100 that is configured to receive the output of the converter as a feedback signal. The adder 100 subtracts the converter output from the oversampled input and provides the difference to an integrator 104. The output of the integrator 104 is provided to a quantizer 108.

The output of the quantizer 108 is fed back to the adder 100 through a digital-analog converter 112, facilitating the operation of the adder 100. The output of the quantizer 108 is typically provided to a digital filter (not shown) for decimation before it is used in subsequent processing.

One drawback to SDC technology is that the RMS noise characteristics of a single SDC stage are proportionate to the reciprocal square root of the oversampling ratio, which is itself a function of the sampling frequency applied to the continuous voltage signal. The requirement of a high oversampling ratio to reduce noise makes an SDC better suited to low frequency applications than high frequency applications.

Accordingly, there is a need for methods and apparatus that provide improved ADC techniques.

SUMMARY OF THE INVENTION

The present invention addresses the shortcomings of existing ADC techniques by providing ADCs integrating higher order SDC stages into pipelined or cyclic architectures.

In one aspect, the present invention provides a pipelined analog-to-digital converter having a first sigma-delta converter, a first sample-and-hold stage, and a second sigma-delta stage. The first sigma-delta stage has a first input terminal, a first output terminal, and a first error terminal. The first sigma-delta stage receives an input signal at the first input terminal, provides a first partial digital output signal at the first output terminal, and provides a first error signal at the first error terminal. The first sample-and-hold stage has a second input terminal in communication with the first error terminal and a second output terminal. The first sample-and-hold stage receives the first error signal at the second input terminal and provides a first hold signal at the second output terminal. The second sigma-delta converter has a third input terminal in communication with the second output terminal and a third output terminal. The second sigma-delta stage receives the first hold signal at the third input terminal and provides a second partial digital output signal at the third output terminal. In this aspect, each of the first sigma-delta converter and the second sigma-delta converter is second-order or higher.

In one embodiment, the converter further includes a combiner and digital corrector having a fourth input terminal in communication with the first output terminal, a fifth input terminal in communication with the third output terminal, and a fourth output terminal. The multiplexer receives the first partial digital output signal at the fourth input terminal and the second partial digital output signal at the fifth input terminal, and provides a combined digital output signal at the fourth output terminal.

In another embodiment, the second sigma-delta converter further includes a second error terminal and provides a second error signal at the second error terminal. The converter further includes a second sample-and-hold stage having a fourth input terminal in communication with the second error terminal and a fourth output terminal, receiving the second error signal at the fourth input terminal and providing a second hold signal at the fourth output terminal. The converter also includes a third sigma-delta converter having a fifth input terminal in communication with the fourth output terminal and a fifth output terminal, receiving the second hold signal at the fifth input terminal and providing a third digital output signal at the fifth output terminal.

One or more of the first partial digital output signal, and the second partial digital output signal may utilize a predetermined number of bits. The converter may include a sample-and-hold strobe selectively enabling the operation of the first sample-and-hold stage. In yet another embodiment, the converter may include a sequencing mechanism controlling the converter such that the operation of the first sigma-delta converter for a particular input signal sample coincides with a first period and the operation of the second sigma-delta converter for the same particular input signal sample coincides with a subsequent period.

In still another embodiment, the converter also includes a sequencing mechanism controlling the converter such that the operation of the second sigma-delta converter for a particular input signal sample coincides with the operation of the first sigma-delta converter for the next input signal sample.

In another aspect, the present invention provides a method for converting an analog signal into a digital signal using a pipelined analog-to-digital converter, wherein each of a first sigma-delta converter and a second sigma-delta converter is second order or higher. An input signal is converted into a first partial digital output signal and a first error signal using a first sigma-delta converter. A first hold signal is provided from the first error signal using a first sample-and-hold stage. The first hold signal is converted into a second partial digital output signal using a second sigma-delta converter.

In one embodiment, the method further includes providing a combined digital output signal using the combination of the first partial digital output signal and the second partial digital output signal. In another embodiment, converting the first hold signal into a second partial digital output signal includes converting the first hold signal into a second error signal, and the method further includes providing a second hold signal from the second error signal using a second sample-and-hold converter and converting the second hold signal into a third partial digital output signal and a third error signal using a third sigma-delta converter. In still another embodiment, the method includes selectively enabling the operation of the first sample-and-hold converter using a strobe. In yet another embodiment, the method further includes controlling the converters such that the operation of the second sigma-delta converter for a particular input signal sample coincides with the operation of the first sigma-delta converter for the next input signal sample.

In still another aspect, the present invention provides a cyclic analog-to-digital converter. The converter includes a multiplexer stage, a sample-and-hold stage, and a sigma-delta converter, with the sample-and-hold stage operated using a sample-and-hold strobe having a first duration significantly greater than subsequent durations and the sigma-delta converter is second order or higher. The multiplexer stage has a first input terminal, a second input terminal, and a first output terminal. The multiplexer stage receives an input signal at the first input terminal and an error signal at the second input terminal and provides a multiplexed output signal at the first output terminal. The sample-and-hold stage has a third input terminal in communication with the first output terminal, a fourth input terminal, and a second output terminal. The sample-and-hold stage receives the multiplexed output at the third input terminal, a sample-and-hold strobe at the fourth input terminal, and provides a hold output signal at the second output terminal. The sigma-delta converter has a fifth input terminal in communication with the second output terminal and a third output terminal in communication with the second input terminal. The sigma-delta stage receives the hold output signal at the fifth input terminal and provides the error signal at the third output terminal. The sample-and-hold strobe may selectively enable the operation of the sample-and-hold stage.

In one embodiment, the converter includes a digital combiner having a sixth input terminal in communication with the third output terminal, receiving at least one partial digital output signal from the sigma-delta converter at the sixth input terminal, and providing a combined digital output signal. In another embodiment, each one of the partial digital output signals, has a predetermined number of bits.

In another aspect, the present invention provides a method for converting an analog signal into a digital signal using a cyclic analog-to-digital converter with a sample-and-hold strobe having a first duration significantly greater than subsequent duration and a sigma-delta converter that is second order or higher. An input signal is directed to a multiplexed output signal using a multiplexer stage. The multiplexed output signal is sampled and held using a sample-and-hold stage under control of a sample-and-hold strobe resulting in a first hold output signal. The first hold output signal is converted to a first partial digital output signal and an analog error signal using a sigma-delta converter. The error signal is directed to a multiplexed output signal using a multiplexer stage. The multiplexed output signal is sampled and held using a sample-and-hold stage under control of the sample-and-hold-strobe resulting in a second hold output signal. The second hold output signal is converted to a second partial digital output signal using a sigma-delta converter.

In one embodiment, the method includes directing at least one partial digital output signal from the sigma-delta converter to a digital combiner and providing a combined digital output signal using the digital combiner.

The foregoing and other features and advantages of the present invention will be made more apparent from the description, drawings, and claims that follow.

BRIEF DESCRIPTION OF DRAWINGS

The advantages of the invention may be better understood by referring to the following drawings taken in conjunction with the accompanying description in which.

In the drawings, like reference characters generally refer to corresponding parts throughout the different views. The drawings are not necessarily to scale, emphasis instead being placed on the principles and concepts of the invention.

DETAILED DESCRIPTION OF THE INVENTION

The present invention addresses the shortcomings of existing ADC techniques by integrating higher order SDC stages into pipelined or cyclic architectures.

Figure 2:
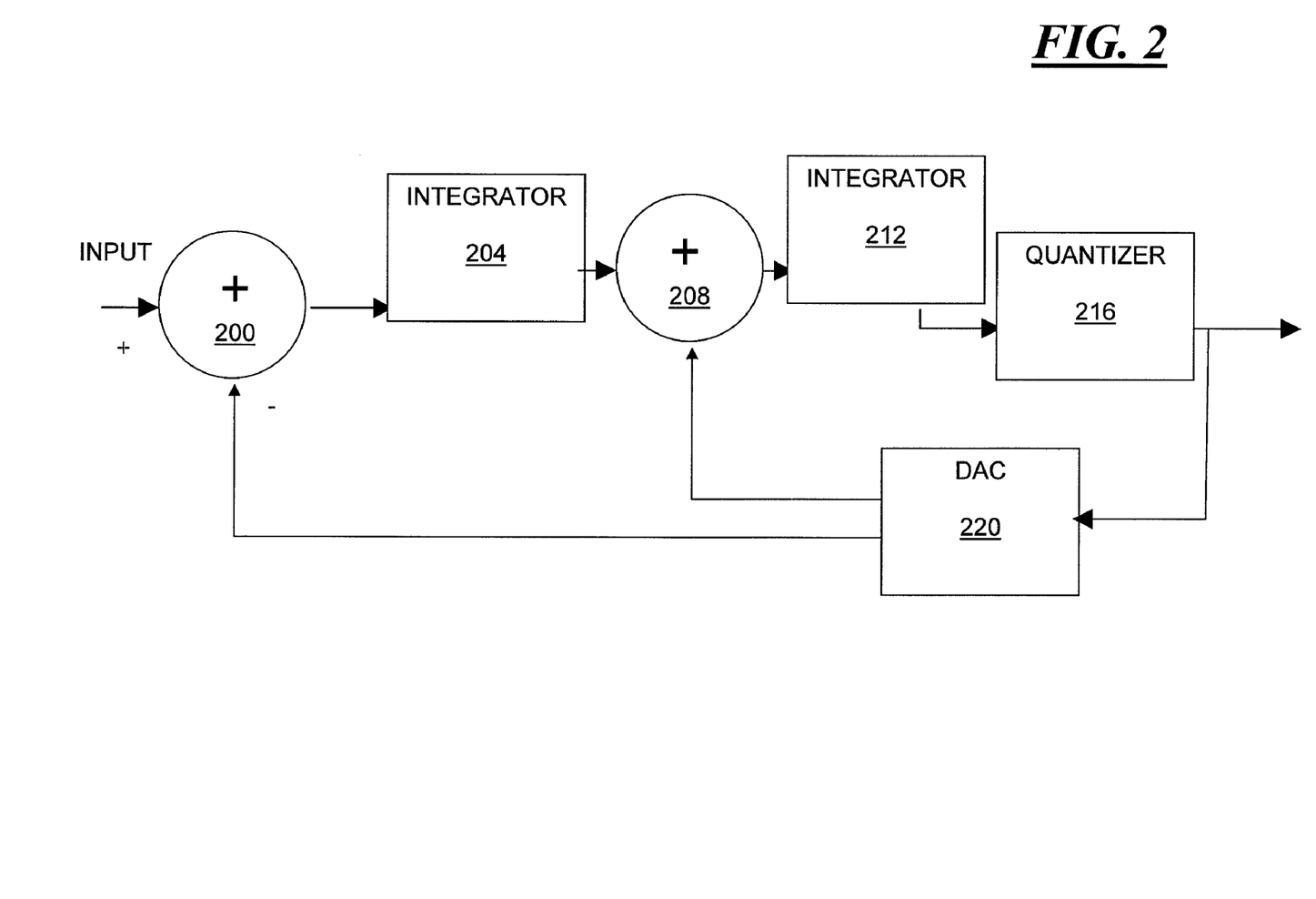
FIG. 2 is a block diagram of a second-order sigma-delta converter.

Embodiments of the present invention utilize SDCs that are second order or higher. FIG. 2 presents a second order SDC suitable for use with various embodiments of the invention. Although second order SDCs are discussed throughout this application, it is understood by one of ordinary skill in the art that a second order SDC may be replaced by a higher order SDC and, accordingly, the use of higher-order SDCs is within the scope of the present invention. Higher order SDCs may be realized by adding integrator stages to a second order SDC, but the phase change induced by this addition may make the SDC unstable. Accordingly, one of ordinary skill in the art may implement a third order or higher SDC using low-pass filters or some other mechanism to address the stability issue.

With reference to FIG. 2, in this SDC a continuous voltage signal is oversampled and provided to a first adder 200 that is configured to receive the output of the SDC as a feedback signal. The adder 200 subtracts the converter output from the oversampled input and provides its own output to a first integrator 204. The output of the first integrator 204 is provided to a second adder 208, which in this configuration operates to subtract the converter output from the output of the integrator 204 and provide its own output to a second integrator 212. The output of the second integrator 212 is provided to a quantizer 216, which in this configuration can be a one-bit or multi-bit quantizer. The output of the quantizer 216 is fed back to the first adder 200 and the second adder 208 through a digital-analog converter 220. The output of the quantizer 216 is typically provided to a digital decimator and filter (not shown) before it is used in subsequent processing.

Pipelined Embodiments

Figure 3A:
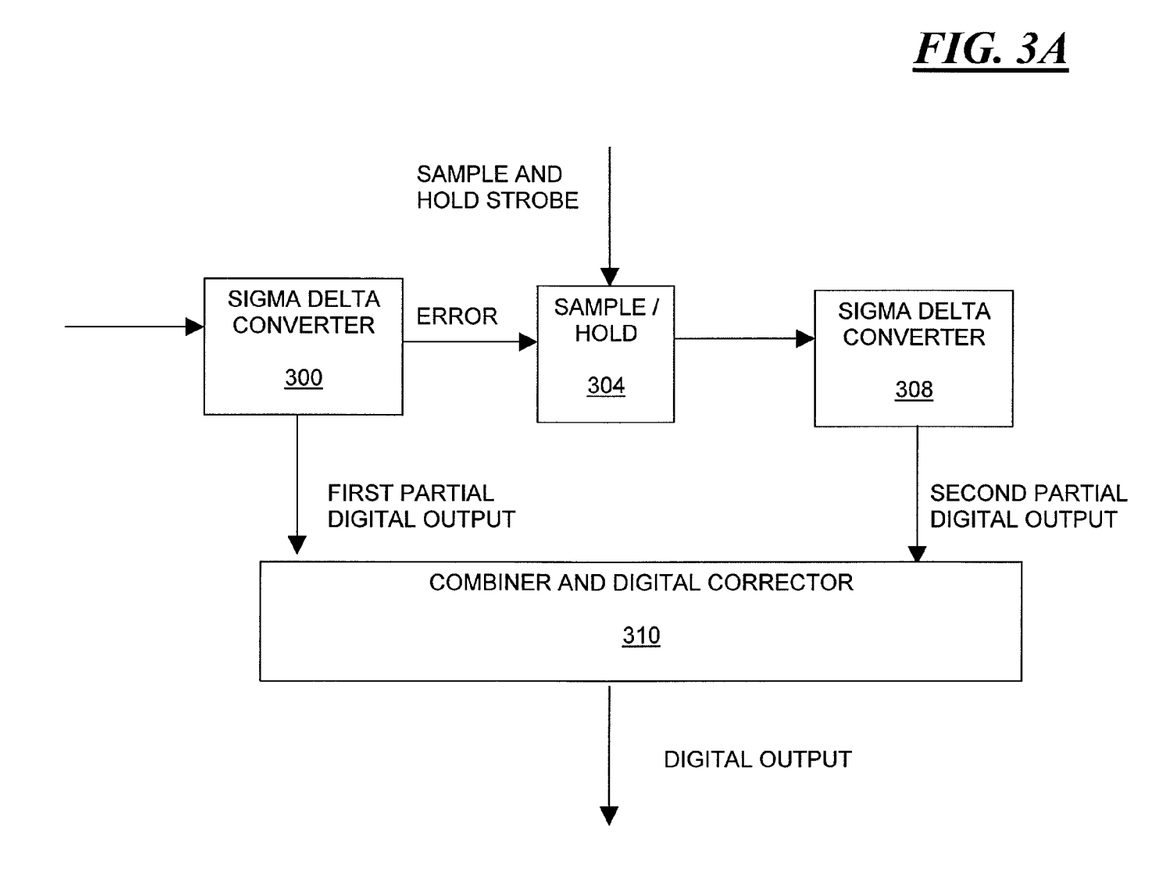
FIG. 3A is a block diagram of one embodiment of the present invention utilizing multiple second-order SDCs in a pipelined architecture.
Figure 3B:
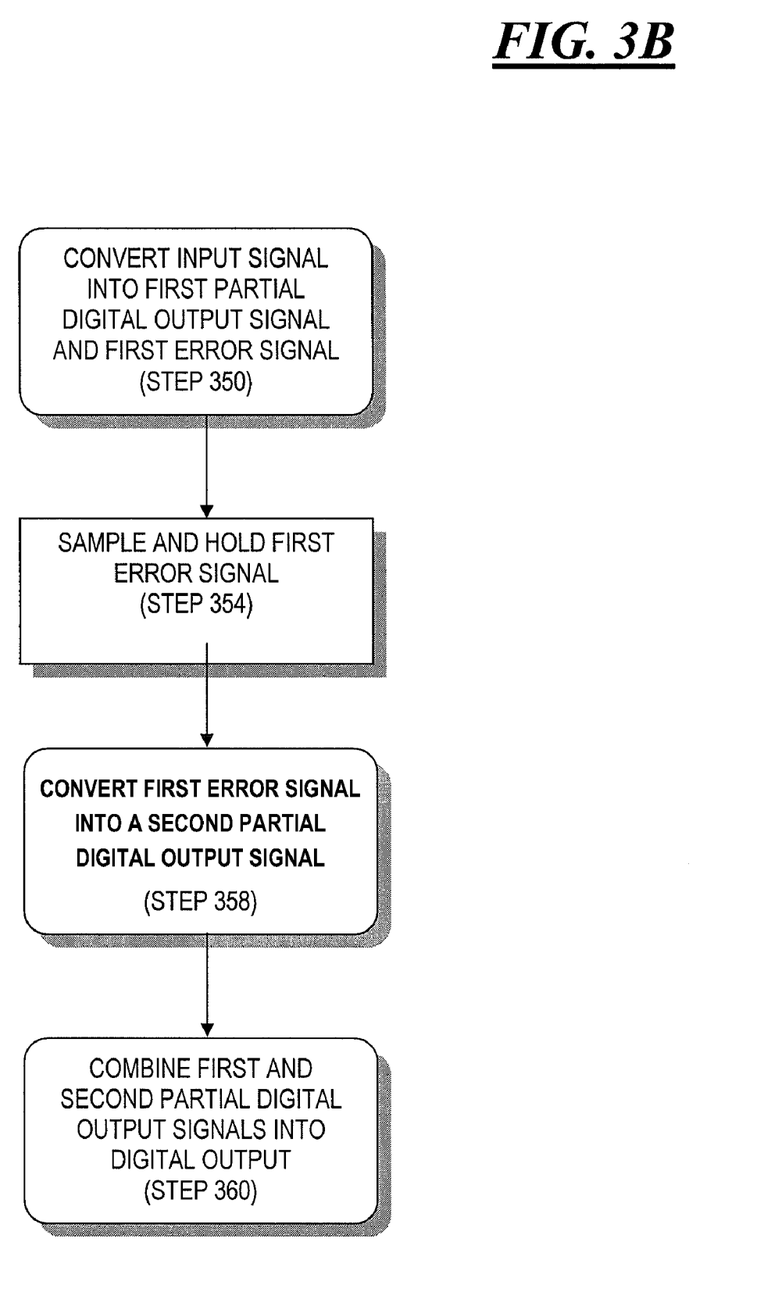
FIG. 3B is a flowchart of a method for providing a digital signal utilizing a pipelined ADC in accord with the present invention.

FIG. 3A presents an embodiment of an ADC in accord with the present invention that uses multiple second order or higher order SDCs in a pipelined architecture. The pipelined architecture effectively divides the signal conversion task among several serial SDCs, achieving higher resolution than a flash configuration using the same cumulative number of SDC stages. FIG. 3B summarizes the operation of a pipelined SDC architecture.

With reference to FIGS. 3A and 3B, a first SDC 300 receives an input signal and converts it to a first partial digital output signal (Step 350), providing the most significant partial bits of the digital output of the ADC. The conversion takes a required number of the modulation clocks (not shown). At the end of the conversion cycle the SDC 300 also provides an analog error signal to the next stage in the ADC for processing (Step 350). The error signal may be computed, for example, by converting the digital output to an analog signal using, e.g., a digital-to-analog converter, and subtracting the result from the original sampled signal. In some implementations of SDC the error signal in analog form is produced inside the SDC. When necessary, the error signal may be amplified before it is provided to the next stage.

The error signal is received by a sample-and-hold stage 304 (Step 354) under control of a sample-and-hold strobe and subsequently sampled and converted to a second partial digital output signal by a second SDC 308 (Step 358). During the sigma-delta conversion of a sampled error signal by the SDC 308 the first SDC 300 is converting the next sample of the input signal. This way both SDCs are working simultaneously on different samples of the input signal, effectively increasing the conversion frequency of the input signal.

Both partial digital output signals are provided to the combiner and digital corrector 310. In combiner and digital corrector 310 the first partial digital signal is delayed until the second partial digital output signal will be produced on the output of the SDC 308. Then both partial digital output signals will be combined into digital output (Step 360). The preliminary digital corrections can be applied to either or both of partial output signals to account for the analog imperfections and mismatches.

Although only two SDCs 300, 308 are depicted to facilitate discussion, it is to be understood that, in accord with the present invention, additional sample-and-hold stages and SDCs, being of second order or higher, may be added in a similar fashion to the pipelined architecture presented in FIG. 3 to achieve whatever resolution and conversion frequency is necessary or desired. All sample-and-hold stages in this arrangement are working under control of the same sample-and-hold strobe.

It is apparent that, in contrast to a configuration using the same cumulative number of SDC stages, which would require larger number of modulation clocks to complete a conversion, a pipelined architecture requires smaller number of modulation clocks for each serial SDC. In effect, the pipelined architecture introduces a latency of one sample-and-hold cycle per SDC stage between the receipt of the input signal and the provision of the final digital output signal.

Cyclic Embodiments

Figure 4A:
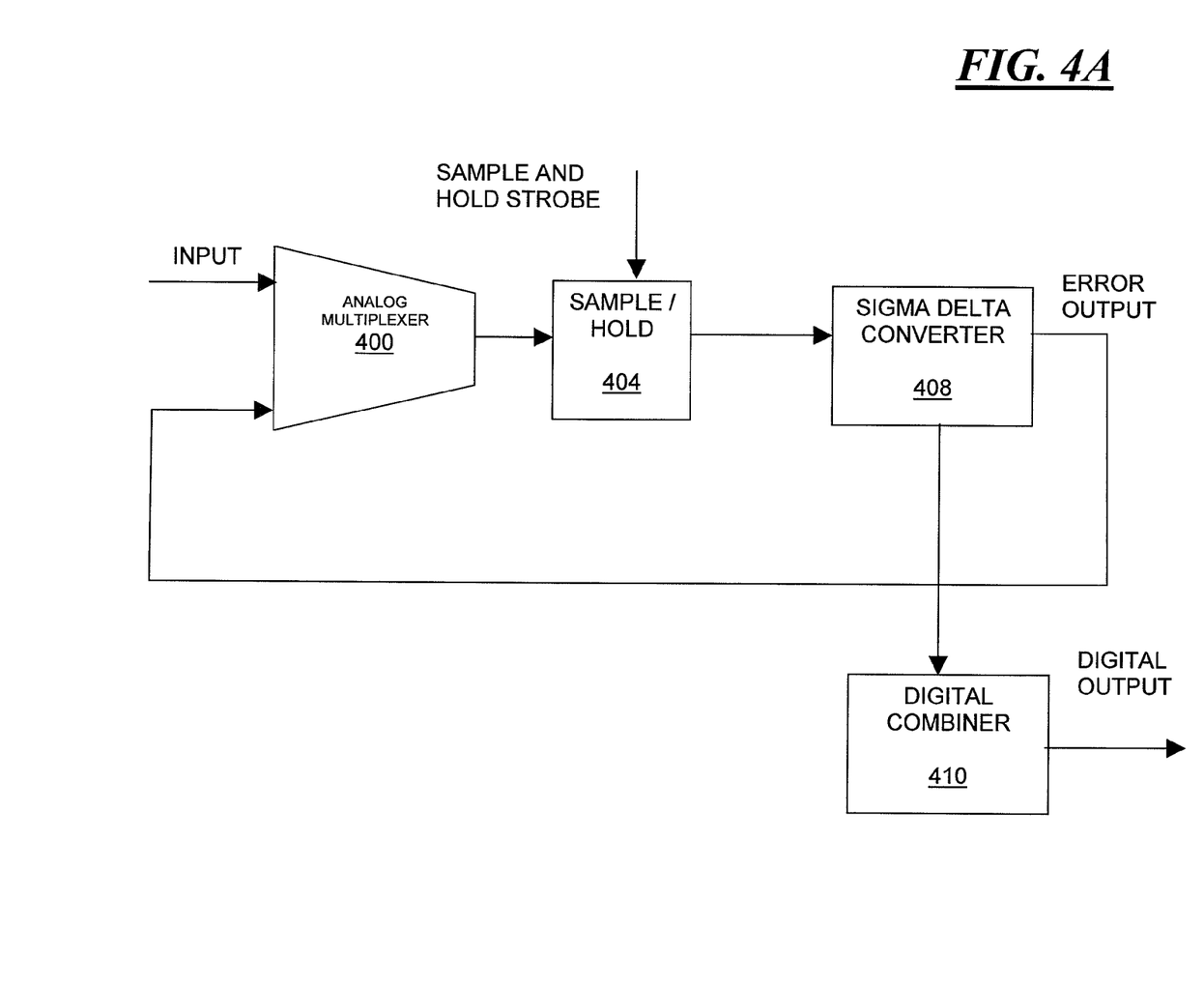
FIG. 4A is a block diagram of another embodiment of the present invention utilizing multiple second-order SDCs in a cyclic architecture.
Figure 4B:
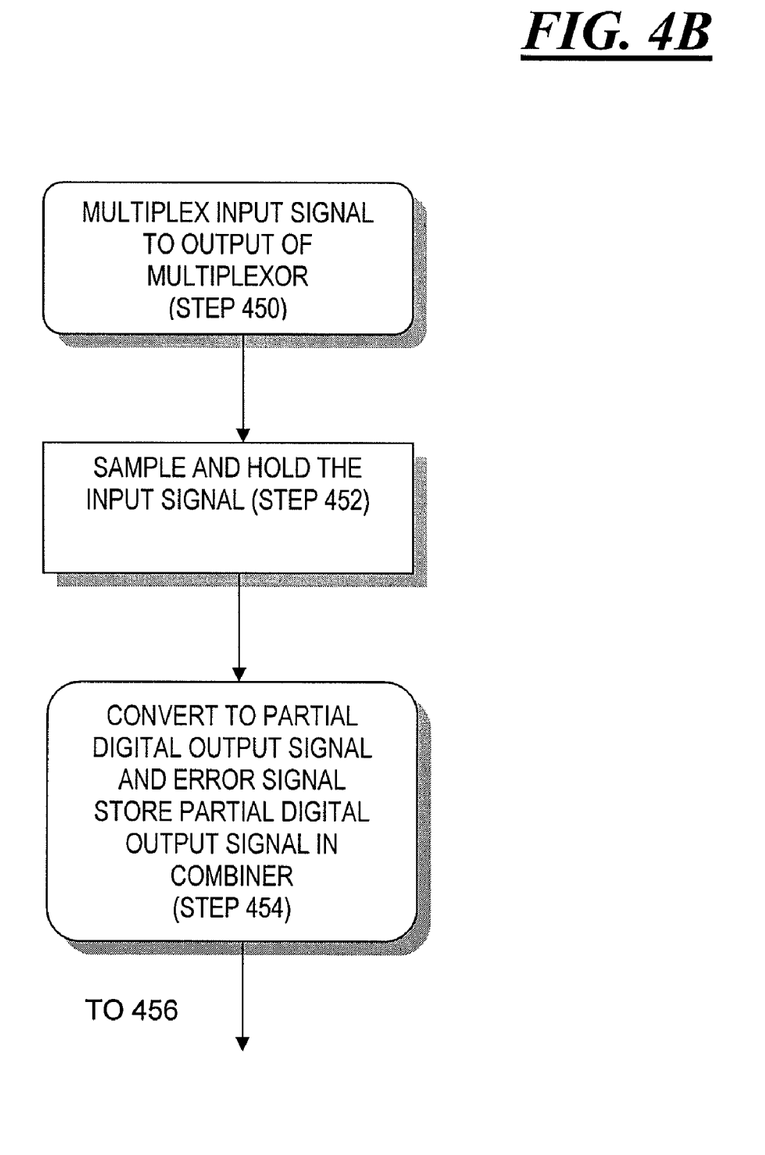
FIGS. 4B & 4C are a flowchart of a method for providing a digital signal utilizing a cyclic ADC in accord with the present invention.
Figure 4C:
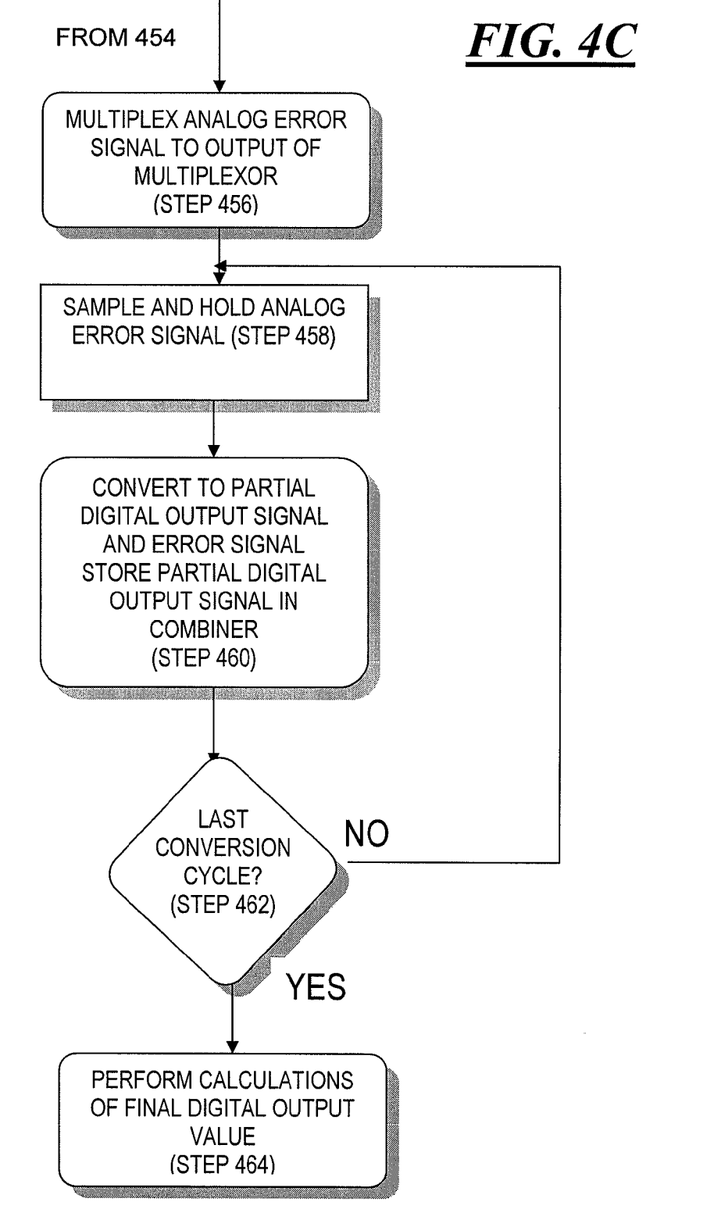

FIG. 4A presents an embodiment of an ADC in accord with the present invention that uses a second order or higher order SDC in a cyclic architecture. The operation of the cyclic architecture resembles the operation of the aforementioned pipelined architecture. However, in lieu of multiple stages each having a sample-and-hold element and an SDC, the cyclic architecture utilizes a single SDC in a feedback configuration to effectively provide the same output as a multi-stage pipelined converter. FIG. 4B summarizes the operation of a cyclic SDC.

With reference to FIGS. 4A and 4B, the input analog signal for measurement is received by an analog multiplexer 400, which in the first cycle of conversion is configured to multiplex the input analog signal to its output (Step 450). In the first cycle of conversion the input analog signal is received by a sample-and-hold stage 404. It is sampled and held in the stage 404 by the first sample-and-hold strobe (Step 452). Then during the first sigma-delta conversion cycle the output signal of the sample-and-hold stage 404 is converted to a first partial digital output using an SDC 408. The first partial digital output from the digital output of SDC 408 is received by the digital combiner 410 and stored in it. At the end of the first sigma-delta conversion cycle the SDC 408 also has an analog error value at its error output. (Step 454).

At the beginning of the second conversion cycle the analog multiplexer 400 is configured in such a way that its analog output is connected to the input carrying the analog error value from the error output of SDC 408 (Step 456). The analog error value is sampled and held in the stage 404 by the second sample-and-hold strobe. (Step 458).

The second sigma-delta conversion cycle starts. During the second sigma-delta conversion cycle the output signal of the sample-and-hold stage 404 is converted to a second partial digital output using an SDC 408. The second partial digital output from the digital output of SDC 408 is received by the digital combiner 410 and stored in it (Step 460).

The process of cyclic conversion may be continued. At the end of the second sigma-delta conversion cycle the analog error signal may be directed through the analog multiplexer 400 to the input of sample-and-hold stage 404 to be sample-and-hold and subject to the further sigma-delta conversion in the SDC 408 during the third sigma-delta conversion cycle, and so on. All the results of the sigma-delta conversion cycles in the form of partial digital output values are received by and stored in the digital combiner 410.

When the last partial digital output is received, the digital combiner 410 performs the calculations to determine the final digital output value (Step 464).

The pipelined architecture of FIG. 3 can, despite the latency introduced, provide one measurement per sample-and-hold cycle. In contrast, the cyclic architecture of FIG. 4 can only provide one measurement at a time, making it suited to applications requiring high resolution at low speeds or non-periodic inputs.

Commercial Applications

Embodiments of the present invention are especially suited to incorporation into ADCs having a large number of channels, e.g., 256 channels or greater. These ADCs may be utilized in biomedical applications, such as computerized axial tomography (CAT) scanners, or bomb detectors.

It will therefore be seen that the foregoing represents a highly advantageous approach to the conversion of analog signals into digital values. The terms and expressions employed herein are used as terms of description and not of limitation and there is no intention, in the use of such terms and expressions, of excluding any equivalents of the features shown and described or portions thereof, but it is recognized that various modifications are possible within the scope of the invention claimed. For example, it is well within the scope of the claimed invention to utilize third order or higher SDC stages, though the illustrative embodiments discussed herein utilize second order SDC stages.

What is claimed is:

1. A pipelined analog-to-digital converter comprising:
a first sigma-delta converter having a first input terminal, a first output terminal, and a first error terminal, receiving an input signal at the first input terminal, providing a first partial digital output signal at the first output terminal, and providing a first error signal at the first error terminal;
a first sample-and-hold stage having a second input terminal in communication with the first error terminal and a second output terminal, receiving the first error signal at the second input terminal and providing a first hold signal at the second output terminal;
a second sigma-delta converter having a third input terminal in communication with the second output terminal and a third output terminal, receiving the first hold signal at the third input terminal and providing a second partial digital output signal at the third output terminal,
wherein each of the first sigma-delta converter and the second sigma-delta converter is second-order or higher.

2. The converter of claim 1 further comprising a combiner and digital corrector having a fourth input terminal in communication with the first output terminal, a fifth input terminal in communication with the third output terminal, and a fourth output terminal, receiving the first partial digital output signal at the fourth input terminal and the second partial digital output signal at the fifth input terminal and providing a combined digital output signal at the fourth output terminal.

3. The converter of claim 1 wherein the second sigma-delta converter further includes a second error terminal and provides a second error signal at the second error terminal, and the converter further comprises a second sample-and-hold stage having a fourth input terminal in communication with the second error terminal and a fourth output terminal, receiving the second error signal at the fourth input terminal and providing a second hold signal at the fourth output terminal, and a third sigma-delta converter having a fifth input terminal in communication with the fourth output terminal and a fifth output terminal, receiving the second hold signal at the fifth input terminal and providing a third digital output signal at the fifth output terminal.

4. The converter of claim 1 wherein the first partial digital output signal and the second partial digital output signal have a predetermined number of bits.

5. The converter of claim 1 further comprising a sample-and-hold strobe, the sample-and-hold strobe selectively enabling the operation of the first sample-and-hold stage.

6. The converter of claim 1 further comprising a sequencing mechanism controlling the converter such that the operation of the first sigma-delta converter for a particular input signal sample coincides with a first period and the operation of the second sigma-delta converter for the same particular input signal sample coincides with a subsequent period.

7. The converter of claim 6 further comprising a sequencing mechanism controlling the converter such that the operation of the second sigma-delta converter for a particular input signal sample coincides with the operation of the first sigma-delta converter for the next input signal sample.

8. A method for converting an analog signal into a digital signal using a pipelined analog-to-digital converter, the method comprising:
converting an input signal into a first partial digital output signal and a first error signal using a first sigma-delta converter;
providing a first hold signal from the first error signal using a first sample-and-hold stage;
converting the first hold signal into a second partial digital output signal using a second sigma-delta converter,
wherein each of the first sigma-delta converter and the second sigma-delta converter is second-order or higher.

9. The method of claim 8 further comprising providing a combined digital output signal using the combination of the first partial digital output signal and the second partial digital output signal.

10. The method of claim 8 wherein converting the first hold signal into a second partial digital output signal further comprises converting the first hold signal into a second error signal, and the method further comprising providing a second hold signal from the second error signal using a second sample-and-hold converter, and converting the second hold signal into a third partial digital output signal and a third error signal using a third sigma-delta converter.

11. The method of claim 8 further comprising selectively enabling the operation of the first sample-and-hold converter using a strobe.

12. The method of claim 8 further comprising controlling the converters such that the operation of the second sigma-delta converter for a particular input signal sample coincides with the operation of the first sigma-delta converter for the next input signal sample.

13. A cyclic analog-to-digital converter comprising:
an multiplexer stage having a first input terminal, a second input terminal, and a first output terminal, receiving an input signal at the first input terminal and an error signal at the second input terminal and providing a multiplexed output signal at the first output terminal;
a sample-and-hold stage having a third input terminal in communication with the first output terminal, a fourth input terminal, and a second output terminal, receiving the multiplexed output at the third input terminal, a sample-and-hold strobe at the fourth input terminal, and providing a hold output signal at the second output terminal; and
a sigma-delta converter having a fifth input terminal in communication with the second output terminal and a third output terminal in communication with the second input terminal, receiving the hold output signal at the fifth input terminal and providing the error signal at the third output terminal;
wherein the sample-and-hold stage is operated using a sample-and-hold strobe having a first duration significantly greater than subsequent durations, and
wherein the sigma-delta converter is second-order or higher.

14. The converter of claim 13 further comprising a digital combiner having a sixth input terminal in communication with the third output terminal, receiving at least one partial digital output signal from the sigma-delta converter at the sixth input terminal, and providing a combined digital output signal.

15. The converter of claim 13 wherein each one of the partial digital output signals has a predetermined number of bits.

16. The converter of claim 13 wherein the sample-and-hold strobe selectively enables the operation of the sample-and-hold stage.

17. A method for converting an analog signal into a digital signal using a cyclic analog-to-digital converter, the method comprising:
directing an input signal to a multiplexed output signal using a multiplexer stage;

sampling and holding the multiplexed output signal using a sample-and-hold stage under control of a sample-and-hold strobe resulting in a first hold output signal;

converting the first hold output signal to a first partial digital output signal and an analog error signal using a sigma-delta converter;

directing an error signal to a multiplexed output signal using a multiplexer stage;

sampling and holding the multiplexed output signal using a sample-and-hold stage under control of the sample-and-hold strobe resulting in a second hold output signal; and converting the second hold output signal to a second partial digital output signal using a sigma-delta converter, wherein the sample-and-hold strobe has a first duration significantly greater than subsequent durations, and wherein the sigma-delta converter is second-order or higher.

18. The method of claim 17 further comprising directing at least one partial digital output signal from the sigma-delta converter to a digital combiner and providing a combined digital output signal using the digital combiner.

* * * * *